United States Patent [19]

Grabbe

[11] 4,410,905
[45] Oct. 18, 1983

[54] POWER, GROUND AND DECOUPLING STRUCTURE FOR CHIP CARRIERS

[75] Inventor: Dimitry G. Grabbe, Lisbon Falls, Me.

[73] Assignee: AMP Incorporated, Harrisburg, Pa.

[21] Appl. No.: 293,022

[22] Filed: Aug. 14, 1981

[51] Int. Cl.³ ..................... H01L 39/02; H01L 23/48; H01L 29/44

[52] U.S. Cl. ...................................... 357/80; 357/70; 357/68; 29/576 R; 29/589; 428/620

[58] Field of Search ........................... 357/80, 70, 68; 174/52 FP; 361/421; 29/576, 589, 591, 827; 428/596, 620, 674

[56] References Cited

U.S. PATENT DOCUMENTS 3,648,122 3/1972 Berglund et al. ................. 29/576 X
4,366,342 12/1982 Breedlove ........................ 357/80 X Primary Examiner—Andrew J. James
Assistant Examiner—Seth Nehrbass
Attorney, Agent, or Firm—Donald M. Boles

[57] ABSTRACT

A chip carrier having a plurality of leads thereon for external interconnection with preferably only one of the leads utilized to provide a source of power to the chip and preferably a single lead utilized as a ground connection. The power and ground leads are connected to an interdigitated lead array at the center of the chip carrier with the chip being secured to the chip carrier above the interdigitated pattern. The chip is bonded to a dielectric sliver which rests above a glass filler and bonding agent which fills the space between the interdigitated pattern and the sliver. The chip is hermetically sealed within the ceramic cap which is bonded to the chip carrier. Power and ground connections are made, from the chip directly to a pair of buses surrounding the interdigitated pattern rather than to leads extending outwardly to the edge of the chip carrier.

11 Claims, 2 Drawing Figures

POWER, GROUND AND DECOUPLING STRUCTURE FOR CHIP CARRIERS

BACKGROUND OF THE INVENTION

1. FIELD OF THE INVENTION

This invention relates to a chip carrier for semiconductor chips, more specifically, to a power, ground and decoupling lead structure whereby a minimum number of chip carrier leads are utilized for power and ground connection and whereby the lead structure provides an integral decoupling capacitor structure having substantially zero inductance.

2. DESCRIPTION OF THE PRIOR ART

Chip carriers for integrated circuit chips are well known in the art and are widely used. Such chip carriers have lead arrays thereon which extend from the outer edges of the chip carrier to a central portion of the carrier where they are then connected to bonding pads on semiconductor chips bonded at and to the center of the chip carrier. The leads on the chip carrier, by virtue of the need of high density, are very narrow and therefore have a recognizable electrical resistance. The chip mounted in the center of the chip carrier, during the time of arrival of a clock pulse, may switch a large number of transistors simultaneously, therefore providing an instantaneous high drain from the power supply. If the resistance of the conductors is sufficiently high, this results in a voltage drop across the chip which renders it sensitive to noise and can cause errors in switching. Therefore it is important to maintain substantially constant potential across the chip. Usually, an attempt is made to handle this problem by placing decoupling capacitors directly adjacent to the chip carrier. This serves to eliminate the problem of voltage drop in the voltage and ground plane in the circuit board or chip carrier but not inside the chip carrier itself. These instantaneous switchings create two types of problems, one is instantaneous voltage drop as noted above and the second is that the self-inductance in the switching network creates an inductive spike. This spike is a source of electrical noise. If a capacitor was available immediately adjacent to the chip with the capability of having zero measurable inductance, it would remove the spike and reduce the noise in the chip.

SUMMARY OF THE INVENTION

In accordance with the present invention, there is provided a lead structure whereby connection can be made from a power and ground pattern directly to the semiconductor chip pads with only one chip carrier lead being required for each of the sources of power and ground potential. Further, the lead patterns for providing power and ground connection also provide an integral decoupling capacitor structure for the system closely adjacent the chip and also can act as a heat sink for the chip.

The above is accomplished by a chip carrier having a plurality of leads thereon for external interconnection with preferably only one of the leads utilized to provide a source of power to the chip and preferably a single lead utilized as a ground connection. The power and ground leads are connected to an interdigitated lead array at the center of the chip carrier with the chip being secured to the chip carrier above the interdigitated pattern. The chip is bonded to an insulating sliver which rests above a glass filter and bonding agent which fills the space between the interdigitated pattern and the sliver. The chip is hermetically sealed within a ceramic cap which is bonded to the chip carrier. Power and ground connections are made from the chip directly to a pair of buses surrounding the interdigitated patterns rather than to leads extending outwardly to the edge of the chip carrier.

DETAILED DESCRIPTION OF THE PREFERRED EMBODIMENT

Figure 1:
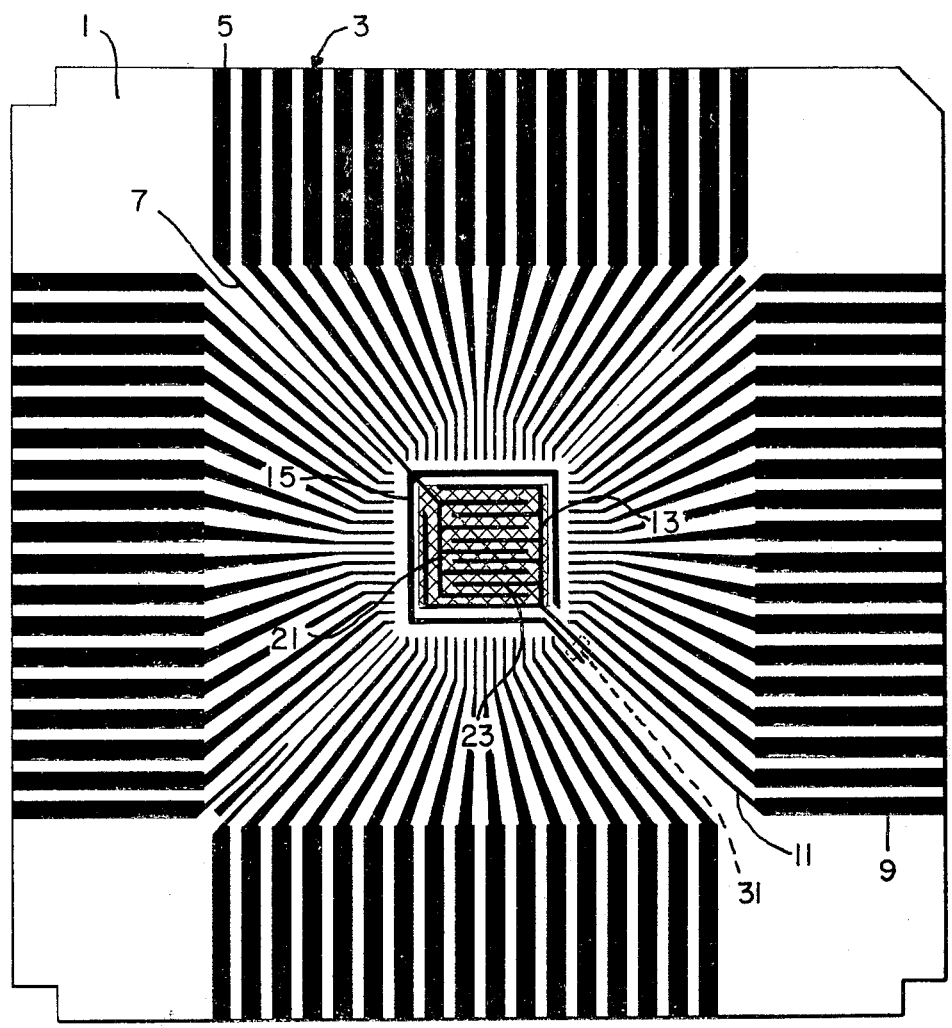
FIG. 1 is a top view of a chip carrier having a lead structure in accordance with the present invention.

Referring first to FIG. 1, there is shown a semiconductor chip carrier 1 of standard construction. Such chip carriers are usually formed from aluminum oxide, beryllium oxide, or other similar electrically insulating ceramic types of material. A lead pattern 3, preferably of copper, is formed on the chip carrier 1 as will be explained hereinbelow, the leads 5 and 9 of the lead area being utilized to provide power and a source of ground potential respectively from an external source to the semiconductor chip as will be described hereinbelow. The lead 5 is connected to a lead portion 7, which is coupled to a bus portion 15 which in turn is connected to comb-shaped lead pattern 21. Pattern 21 is interdigitated with the comb-shaped lead pattern 23 which is connected to bus 13 which in turn is connected to the pad 9 through the lead portion 11. It can therefore be seen that the power bus 15 is interdigitated with the ground bus 13 at the center portion of the chip carrier over which the semiconductor chip will be mounted in a manner to be described hereinbelow.

A decoupling capacitor represented as 31 is provided as a result of the capacitance between the interdigitated fingers 21 and 23 because the fingers are disposed upon and embedded in a dielectric substrate 1. The capacitor 31, as shown, is therefore symbolic of the capacitor action taking place at the interdigitated pattern. This capacitor has substantially no inductance.

Figure 2:
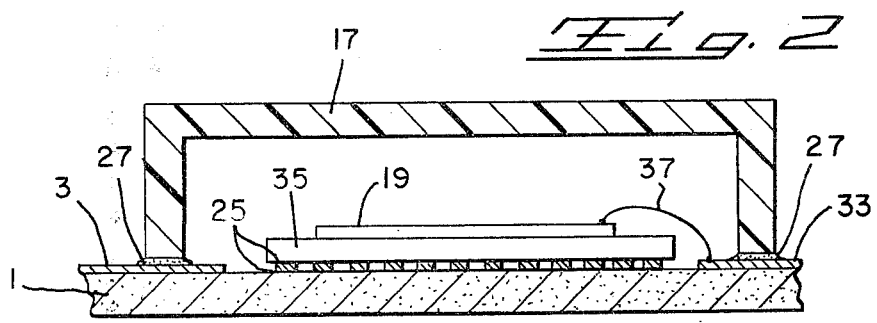
FIG. 2 is a cross-sectional view of the chip carrier of FIG. 1 with a semiconductor chip and appropriate structure for providing a completed circuit.

Referring now to FIG. 2, there is shown the chip carrier 1 having lead 33 thereon and the interdigitated pattern (not shown) beneath a glass filler having barium titanate therein and bonding agent 25 which fills the space between the interdigitated pattern on the chip carrier 1 therebeneath and a beryllium oxide chip sliver 35. A semiconductor chip 19 is bonded to the sliver 35, preferably with indium-bearing solder. A lead 37 is shown connected from a pad on the chip 19 to one of the leads 33 in well known manner. A ceramic cap 17 is bonded to the carrier 1 by means of sealant 27 which attaches the cap over the leads 3 on the substrate 1. This provides an hermetic seal and seals the chip within the cap.

The beryllium oxide sliver 35 can be mounted, metallized on the top side if a soldering attachment of the chip will be used, or without metallization if a silver epoxy die attachment will be used. The chip 19 rests directly on top of the sliver 35 and propogates heat through the sliver. The interdigitated metal pattern, in addition to providing the capacitive coupling noted above, also is a good heat conductor with a high heat spreading coefficient. The net result of this structure is therefore to provide a low junction-to-case thermal resistance.

The copper lead frame is secured to the ceramic substrate by oxidizing one surface of the lead frame to form copper oxide and them forming a bond of the copper oxide and ceramic by the procedure described in the U.S. Pat. Nos. of Burgess et al. (3,744,120), Babcock et al. (3,766,634), Burgess et al. (3,854,892), Burgess et al. (3,911,553), Cusano et al. (3,994,430) and Cusano et al. (4,129,243).

It can be seen that, in accordance with the present invention, a separate decoupling capacitor is not required and, in addition, only a single lead on the chip carrier or substrate is required for connection to the external world for each of the sources of power and ground potential.

Though the invention has been described with respect to a preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A system for carrying semiconductor chips and the like comprising:
   (a) an electrically insulating substrate,
   (b) an electrical conductor pattern on said substrate extending to plural locations at the edges of said substrate, and
   (c) an interdigitated pattern of electrically conductive material formed at a central region of said substrate, said pattern having two unconnected portions, each portion being connected to a different location at the edge of said substrate.

2. A system as set forth in claim 1 wherein said substrate is formed from a ceramic material.

3. A system as set forth in claim 1 further including an insulating sliver secured over said interdigitated pattern.

4. A system as set forth in claim 3 further including a semiconductor chip secured over said insulating sliver and means coupling plural pads on said semiconductor chip to one of said two unconnected portions.

5. A system as set forth in claim 3 further including glass filler means bonding said insulating sliver to said pattern.

6. A system as set forth in claim 4 further including glass filler means bonding said insulating sliver to said pattern.

7. A system as set forth in claim 4 further including indium-bearing solder means bonding said semiconductor chip to said insulating sliver.

8. A system as set forth in claim 6 further including indium-bearing solder means bonding said semiconductor chip to said insulating sliver.

9. A system as set forth in claim 5 where said glass filler includes barium titanate.

10. A system as set forth in claim 6 where said glass filler includes barium titanate.

11. A system as set forth in claim 8 where said glass filler includes barium titanate.

* * * * *